US006398855B1

(12) United States Patent
Palmans et al.

(10) Patent No.: US 6,398,855 B1
(45) Date of Patent: Jun. 4, 2002

(54) METHOD FOR DEPOSITING COPPER OR A COPPER ALLOY

(75) Inventors: Roger Palmans, Riemst; Yuri Lantasov, Leuven, both of (BE)

(73) Assignee: IMEC VZW, Kapeldreef (BE)

( * ) Notice: Subject to any disclaimer, the term of this patent is extended or adjusted under 35 U.S.C. 154(b) by 0 days.

(21) Appl. No.: 09/459,449

(22) Filed: Dec. 13, 1999

Related U.S. Application Data
(60) Provisional application No. 60/116,110, filed on Jan. 15, 1999.

(30) Foreign Application Priority Data

Apr. 29, 1999 (EP) .......................................... 998700777

(51) Int. Cl.[7] .............................................. C23C 18/40
(52) U.S. Cl. ................... 106/1.23; 106/1.26; 427/443.1
(58) Field of Search ............................... 106/1.23, 1.26; 427/443.1

(56) References Cited

U.S. PATENT DOCUMENTS

| | | | | |
|---|---|---|---|---|
| 3,615,735 A | * | 10/1971 | Shipley, Jr. et al. | 106/1.23 |
| 4,209,331 A | * | 6/1980 | Kukanskis et al. | 106/1.23 |
| 4,265,943 A | * | 5/1981 | Goldstein et al. | 427/305 |
| 4,279,948 A | * | 7/1981 | Kukanskis et al. | 427/305 |
| 4,956,014 A | * | 9/1990 | Kondo et al. | 106/1.23 |
| 5,221,328 A | * | 6/1993 | Bishop et al. | 106/1.23 |
| 5,419,926 A | * | 5/1995 | Soltys | 427/443.1 |
| 6,174,353 B1 | * | 1/2001 | Yuan et al. | 106/1.23 |

FOREIGN PATENT DOCUMENTS

SU  1312119 A1  5/1987

OTHER PUBLICATIONS

Abstract for SU 1312119 A1; "Chemical Copper Plate Solution Contain Copper Sulphate Potassium Sodium Tartrate Sodium Hydroxide Formaldehyde Add Pentaerythritol Glycerol Ethylene Glycol Water", 5/87.
European Search Report; EP 99087 00 77; Dec. 6, 1999.

* cited by examiner

Primary Examiner—Helene Klemanski
(74) Attorney, Agent, or Firm—Knobbe, Martens, Olson, and Bear LLP

(57) ABSTRACT

The present invention is related to the fabrication of at least a part of a Cu-containing layers or a Cu-containing pattern used for the electrical connection of active or passive devices as well as integrated circuits. Such Cu-containing patterns and/or layers are formed on an activated surface of a substrate by means of immersion of said substrate in an electroless Cu plating solution. Such a solution typically comprises: a source of copper Cu (II) ions; a reducing agent; an additive to adjust the pH of said aqueous solution to a predetermined value; and a chemical compound for complexing said Cu ions, said chemical compound having at least one part with chemical structure COOR1-COHR2, R1 being a first organic group covalently bound to the carboxylate group (COO), R2 being either hydrogen or a second organic group. Further disclosed is a method for depositing Cu on an activated surface and particularly on an activated surface of a Cu diffusion barrier layer.

19 Claims, 6 Drawing Sheets

METHOD FOR DEPOSITING COPPER OR A COPPER ALLOY

This application claims priority to U.S. Provisional Application No. 60/116,110 filed on Jan. 15, 1999, and European Application No. 99870077.7 filed Apr. 29, 1999.

FIELD OF THE INVENTION

The present invention is related to metal deposition processes as used for instance for the formation of conductive patterns connecting active or passive devices as well as integrated circuits. Particularly, such conductive patterns can be formed at least partly by means of an electroless deposition technique.

BACKGROUND OF THE INVENTION

Currently, copper is being introduced in ULSI metallization schemes as a replacement for aluminum due to its lower resistivity and better electromigration resistance. Copper electroplating is the most popular deposition technique today. To avoid contamination of the surrounding insulating layers and/or the substrate, copper is mostly deposited on a Cu diffusion barrier layer. However, to allow electroplating, first a conductive seed layer has to be formed on top of the barrier layer(s) in order to get reliable electroplated copper deposition. Usually, a sputtered copper layer is used for this purpose. However, for dual damascene type processing with very high aspect ratio openings in dielectric layers such as trenches, via holes and contact holes, the step coverage of sputtered (classical or by means of an Ion Metal Plasma) barrier layers and Cu seed layers is expected to become the limiting factor for subsequent filling with e.g. electroplated copper. As a consequence, alternative deposition routes for copper seed layer formation can be attractive for future device technologies. Electroless copper deposition has the potential of becoming a viable alternative because it can deliver high step coverage depositions at a very low cost. The principle of electroless metal deposition is based on the generation of electrons at a catalytically active or an activated surface in contact with a solution of metal ions in the presence of a suitable sacrificial electron donor. These electrons are capable of reducing the metal ions leading to the deposition of the metal on the activated surface. Because this process does not occur on non-activated layers, the resulting deposition technique is inherently selective. Furthermore, in principle, it should be easy to integrate such process in currently available copper electroplating tools (which are already on the market or will be so in the near future), provided amongst others that the electroless plating solution is stable at room temperature for at least about two weeks and the process margins of the plating solution are not too tight. Nowadays most electroless copper plating solutions do not meet these specifications. They have often a limited stability and can only be effectively used in a limited pH range which makes them very sensitive for slight variations in the composition of the plating solution as such variations result in small variations in the pH but often lead to a large decrease in the deposition rate.

Moreover, most available electroless copper plating baths do not fulfill the stringent requirements for copper plating in sub-micron high aspect ratio features onto the typical Cu diffusion barrier layers used in ULSI processing. Typical barrier layers are Ti, TiN, Ta, $WN_x$, TaN, Co and any combination thereof, and other Cu diffusion barrier layers known in the art. One of the problems of electroless copper deposition on barrier layers and particularly on e.g. TiN is the evolution of copious amounts of hydrogen gas which is detrimental for the quality of the copper layer formed because it leads to severe blistering of the copper layer. The use of cyanide as a hydrogen suppressor, as practiced in many commercial copper plating solutions, is not acceptable in this business due to safety issues. Another problem related to the state-of-the-art plating solutions is the bad adhesion of electroless deposited copper on such barrier layers.

Moreover, most electroless copper plating solution compositions are based on salts containing mainly sodium as the counterion. These high levels of sodium ions in the plating solutions can introduce severe reliability problems, particularly when sodium reaches the semiconductor device junctions, as this is known to be a production yield killer in semiconductor device manufacturing. Therefore as a further requirement the level of sodium ions in the plating solution should be very limited or negligible.

Nowadays, electroless copper plating solutions often use EDTA as the complexing agent and formaldehyde as the reducing agent. The complexing agent is required to keep Cu(II) ions in solution at the relatively high pH values at which formaldehyde operates as a reducing agent. Recently, the trend is to move away from strong complexants such as EDTA. Due to their strong complexing power for many metal ions, more stringent requirements for the environment are expected for plating solutions based on strong complexing agents. Consequently, there is a need for other more environmentally acceptable complexing agents.

AIMS OF THE INVENTION

It is an aim of the invention to provide a plating solution for electroless copper deposition which is substantially sodium free (low level sodium) and which comprises an environmentally friendly complexing agent. The plating solution should have a long life-time after make-up (thermal stability) of at least two weeks at room temperature and should be easy to replenish to keep the plating characteristics well within specifications over the plating periods. Furthermore, slight variations in the composition of the plating solution may cause only small variations in the Cu deposition rate on an activated surface of a substrate immersed in the plating solution.

It is another aim of the invention to provide a method to form Cu-containing layers on an activated surface of a substrate by means of an electroless deposition technique using the plating solution of the present invention. This plating solution and deposition method should be such that the formation of hydrogen gas during the plating period is avoided or severely limited. Particularly, this method has to result in a sufficiently high deposition rate at low temperatures.

A further aim of the invention is to provide a Cu seed layer on a diffusion barrier layer, said diffusion barrier layer may act simultaneously as a wetting layer. Particularly when a Cu-containing layer is deposited on a barrier layer, the Cu-containing layer has to be formed with good adhesion on the diffusion barrier layer. Seed layers have typically a thickness below 300 nm.

Still a further aim of the invention is to provide a Cu plating solution suitable to form a relatively thick Cu-containing layer on a barrier layer or on a seed layer. This is particularly useful to fill up openings with high aspect ratios in insulating layers such as via holes, trenches and contact holes like e.g. in damascene architectures. The Cu-containing layers formed have typically a thickness between 200 nm and 2 $\mu$m.

SUMMARY OF THE INVENTION

The present invention is related to the fabrication of at least a part of a Cu-containing layers or a Cu-containing pattern used for the electrical connection of active or passive devices as well as integrated circuits. Such Cu-containing patterns and/or layers can be formed on an activated surface of a substrate by means of immersion of said substrate in an electroless plating solution. Therefore, in an aspect of the present invention, an aqueous solution for electroless deposition of Cu on a substrate is disclosed, said solution comprising:

a source of copper Cu (II) ions;

a reducing agent;

an additive to adjust the pH of said aqueous solution to a predetermined value; and a chemical compound for complexing said Cu ions, said chemical compound having at least one part with chemical structure COOR1-COHR2 (as can be seen in FIG. 2a)), R1 being a first organic group covalently bound to the carboxylate group (COO), R2 being either hydrogen or a second organic group. Examples of such first or second organic groups are hydrocarbon groups, while for instance the chemical compound for complexing the Cu ions can be selected from the group consisting of diethyltartrate, diisopropyltartrate and diethyllactate. The pH of the plating solution ranges typically from 11 or 11.5 to 13.5, while the temperature at which the solution can be applied ranges from 10 to 50 degrees C. or, 45 degrees C. or below, or from room temperature to 40 degrees C. Examples of a reducing agent are formaldehyde, paraformaldehyde, hydrazine, amine boranes, alkali metal borohydrides, alkali metal hypophosphites or a derivative of one of the aforementioned reducing agents.

In an embodiment of the invention, a Cu plating solution is disclosed based on an organic based complexing agent, wherein the ratio between the concentration of said source of copper Cu (II) ions and the concentration of said complexing agent in said solution is in the range from 1/5 to 5/1 or from 1/10 to 10/1 or from 1/25 to 25/1.

In another embodiment of the invention, a Cu plating solution is disclosed wherein the complexing agent is a chemical compound with chemical structure COOR1-CHOH—CHOH—COOR1, R1 being an organic group covalently bound to the carboxylate group (COO). For instance, hydrocarbon groups can be used as organic groups. Particularly, a chemical compound selected from the group consisting of diethyltartrate, diisopropyltartrate and dimethyltartrate can be selected.

In another aspect of the invention, a method is disclosed for forming a Cu-containing layer on a substrate comprising the steps of:

preparing an aqueous solution comprising a source of copper Cu (II) ions, a reducing agent, a chemical compound for completing said Cu (II) ions, said chemical compound having at least one part with chemical structure COOR1-COHR2, R1 being an organic group covalently bound to the carboxylate group (COO), R2 being either hydrogen or an organic group, and an additive to adjust the pH of the solution to a predetermined value;

immersing said substrate in said aqueous solution for a predetermined period to thereby form said Cu-containing layer at least on an activated surface of said substrate. For instance, this Cu-containing layer can be formed on a Cu diffusion barrier layer formed on the substrate.

In an embodiment, a method for filling an opening in an insulating layer is disclosed, wherein, after forming at least one opening in an insulating layer formed on a substrate, a barrier layer can be formed on at least one inner wall of said opening. Examples of such openings are via holes, contact holes, and trenches. Examples of such barrier layers are layers of Ti, or TiN, or Ta, or tungsten nitride, or TaN, or Co or a combination thereof. Particularly this barrier layer can also act as a wetting layer like e.g. a TiN layer with a Ti layer thereon. A Cu-containing metal, i.e. an alloy of or pure Cu, is deposited using the electroless plating solution of the present invention. This electroless deposition can be performed in a chamber of a electrodeposition tool. The electroless deposition can be performed in at least one deposition step to thereby completely fill the openings. Alternatively, first a thin Cu-containing seed layer can be formed using the electroless deposition method of the present invention, thereafter a second Cu-containing metal can be deposited on said seed layer using a different Cu deposition technique as e.g. electroplating of Cu to thereby completely fill the openings.

DETAILED DESCRIPTION OF THE INVENTION

In relation to the appended drawings the present invention is described in detail in the following. It is apparent however that a person skilled in the art can imagine several other equivalent embodiments or other ways of executing the present invention, the spirit and scope of the present invention being limited only by the terms of the appended claims.

Figure 1:
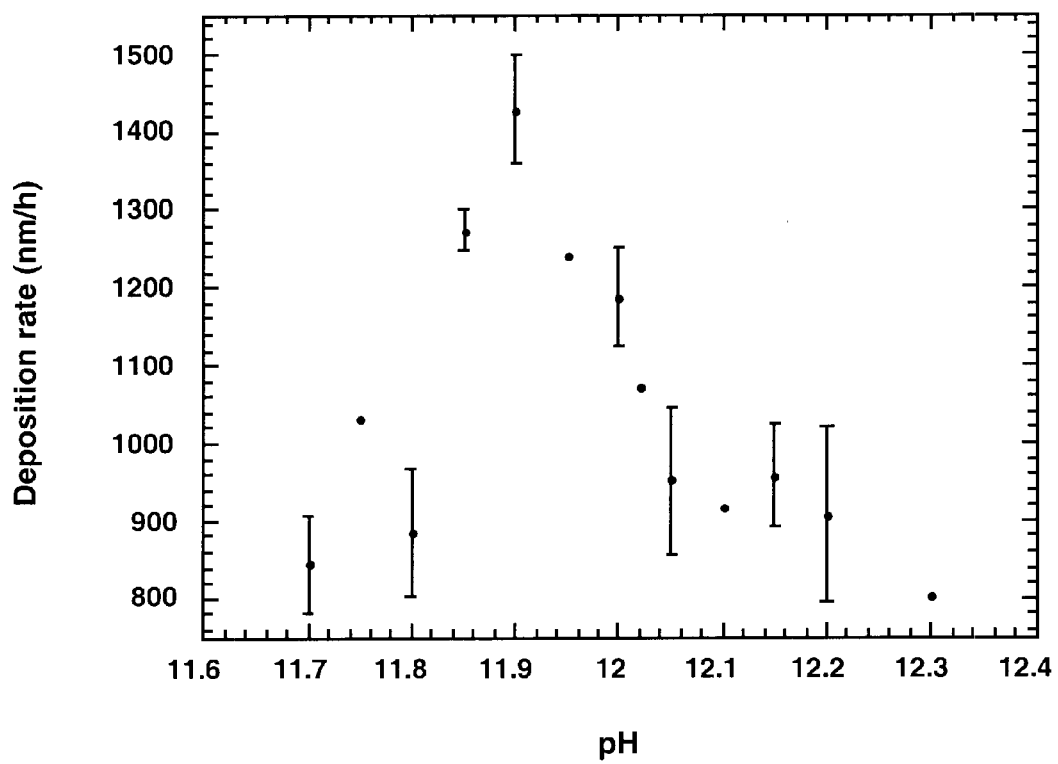
FIG. 1 depicts the deposition rate of a tartrate$^{2-}$ ions based salt Cu plating solution versus the pH value of the solution.

The use of tartrate$^{2-}$ ions based salts as complexing agents for copper(II) ions in electroless plating solutions is known for many years. However, only the sodium, potassium and NaK (Rochelle salt) salt have been used extensively in electroless copper plating solution compositions. A disadvantages of the latter type of plating solution is the very low deposition rate at room temperature. Another disadvantage is the sensitivity of these state-of-the-art complexing agents for small variations in the composition of the plating solution which directly affects the pH of the solution. Therefore even if one succeeds in obtaining a more or less stable initial solution, while plating proceeds, a small change in the composition and consequently in the pH of the solution caused by the deposition of Cu causes dramatic changes in the deposition rate due to the limited width of the pH window at which the deposition rate is more or less constant (as e.g. in FIG. 1).

A further disadvantage is that electroless deposition using a plating solution based on tartrate$^{2-}$ ions based salts leads to hydrogen gas evolution which not only prevents deposition of layers with a thickness above 150 nm, but also thinner layers (below 150 nm) are of bad quality due to hydrogen inclusion in the deposited layer.

A further disadvantage of electroless deposition using a plating solution of these tartrate$^{2-}$ ions based salts containing mainly sodium or potassium as counterion is that these counterions are highly mobile and easily migrate to the junction level of the semiconductor devices which is detrimental for the reliability of these devices.

Moreover, it should be stated that successful plating of electroless copper on an arbitrary surface of a substrate involves both cleaning of the surface and activation with Pd nuclei prior to copper plating.

Figure 2A:
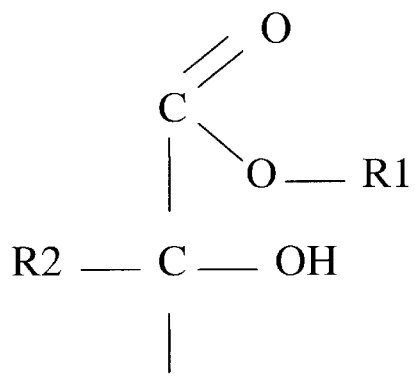
FIG. 2 depicts three different chemical structures. According to the present invention, in FIG. 2a) a chemical compound for complexing Cu ions is depicted having at least a part with chemical structure COOR1-COHR2, R1 being a first organic group covalently bound to the carboxylate group (COO), R2 being either hydrogen or a second organic group, while in FIG. 2b) a chemical compound with chemical structure COOR1-CHOH—CHOH—COOR1 is depicted, and FIG. 2c) depicts the chemical structure of diethyltartrate.
Figure 2B:
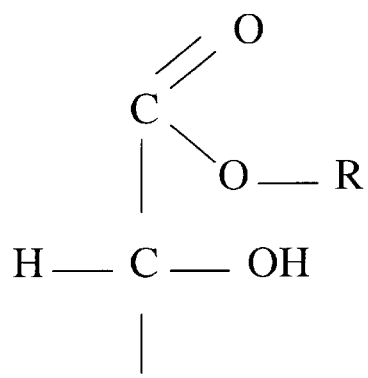

In a preferred embodiment of the invention, a method is disclosed for forming a Cu-containing layer on an activated surface of a Cu-diffusion barrier layer formed on a substrate comprising the steps of:

preparing an aqueous solution comprising a source of copper Cu (II) ions, a reducing agent, a chemical compound for complexing Cu (II) ions, said chemical compound having chemical structure COOR1-CHOH—CHOH—COOR1 (as in FIG. 2b)), R1 being an organic group covalently bound to the carboxylate group (COO), and an additive to adjust the pH of the solution to a predetermined value;

immersing said substrate with said Cu-diffusion barrier layer in said aqueous solution for a predetermined period to thereby form said Cu-containing layer at least on said activated surface of said Cu-diffusion barrier layer.

Figure 2C:
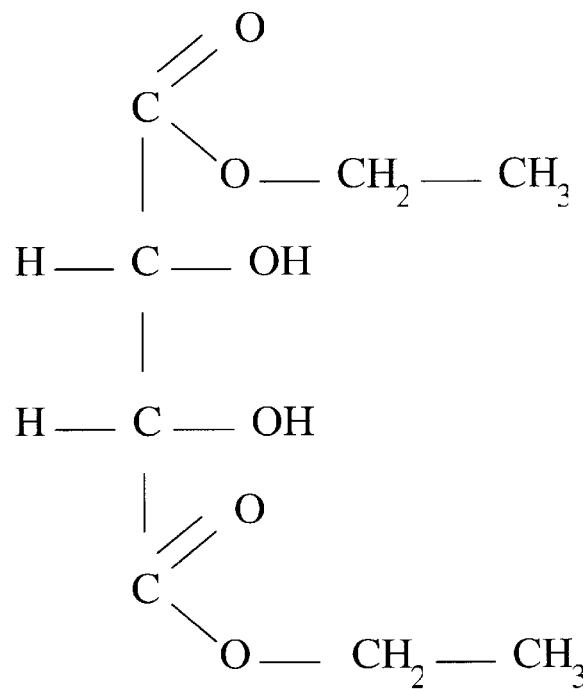

At least for the purpose of this disclosure, an organic tartrate is defined as a chemical compound with chemical structure COOR1-CHOH—CHOH—COOR1, R1 being an organic group covalently bound to the carboxylate group (COO). For instance, these organic groups can be hydrocarbon groups. Examples of such organic tartrates are diethyltartrate (FIG. 2c)), diisopropyltartrate and dimethyltartrate.

In order to avoid copper(II)hydroxide deposition at high pH values, an organic tartrate is added for complexing the Cu(II) ions. Particularly, diethyltartrate, is used. The organic tartrates are characterized by a different complexation behaviour with Cu(II) ions as compared to ionic tartrate, i.e. tartrate$^{2-}$ ions based salts. Although the precise nature of the complexation behaviour is not fully understood, experiments demonstrate that deposition using the plating solution of the present invention, i.e. an organic tartrate based solution, unexpectedly overcomes or at least substantially limits the hydrogen evolution during the deposition process, probably due to the different complexing behavior, particularly when a deposition is performed on a barrier layer. It is believed that when adding an organic tartrate to the solution, in contrast to adding tartrate$^{2-}$ ions based salts, no carboxylate ions are created. As a consequence, the complexation of Cu(II) ions occurs mainly at higher pH values. Probably this complexation is mainly, but not limited hereto, based on at least one hydroxyl group of the organic tartrate, particularly on the corresponding anion.

CuSO$_4$.5H$_2$O can be used as a source of copper Cu (II) ions or other sources known in the art. Formaldehyde acts as a sacrificial electron donor, i.e. a reducing agent. The invention is in no way limited to the use of formaldehyde as sacrificial electron donor. Formaldehyde vapors are a potential health liability because of suspected carcinogenity. However, one could opt to use the solid form, i.e. paraformaldehyde which is less dangerous. One could also opt to add paraformaldehyde to the solution provided that first the plating solution is brought to a higher pH. This probably further limits health risks.

The operation range for the pH of this plating solution is typically between pH 11.5 and 13.5. The correct pH value is adjusted by addition of an additive like e.g. tetra-N-methylammoniumhydroxide (Me$_4$NOH). Other examples are the alkali metal hydroxides or others known in the art.

The substrate can be at least a part of a partly processed or a pristine wafer or slice of a semi-conductive material, like e.g. Si or GaAs or Ge or SiGe, or an insulating material, like e.g. a glass slice, or a conductive material. Said substrate can comprise a patterned insulating layer. Particularly, in case said substrate is a partly processed wafer or slice; at least a part of the active and/or passive devices can already be formed and/or at least a part of the structures interconnecting these devices can be formed.

Examples of Cu diffusion barrier layers are Ti, TiN, Ta, tungsten nitride, TaN, Co or any combination thereof. A more particular example of such a barrier layer is TiN. When stating that the hydrogen evolution is substantially limited during deposition on a barrier layer, this means that on such barrier layers high quality Cu-containing layers with a thickness of at least 150 nm or at least 300 nm can be formed. Also thicker layers can be formed, e.g., layers with a thickness ranging up from 1 $\mu$m or even up to 2 $\mu$m.

The electroless plating of copper on barrier layers involves both cleaning of the barrier layer surface and activation of the clean barrier layer with Pd nuclei prior to copper plating. For instance, cleaning of a TiN surface can be accomplished with dilute HF solutions in order to remove surface nitrided titanium dioxide species. Other cleaning procedures have been described in the literature. Activation is accomplished by treatment of the clean TiN surface with a Palladium activator solution, typically containing PdCl$_2$ and HCl in aqueous solution. Optional additives are HF and/or acetic acid, as known in the art. It is understood that each process step should be followed by an adequate rinse, for instance with DI water, as usually required in the art. In some instances, depending on the quality of the TiN surface, additional drying after either pre-clean or activation step, or after both steps, can improve the electroless copper layer quality.

Figure 4:
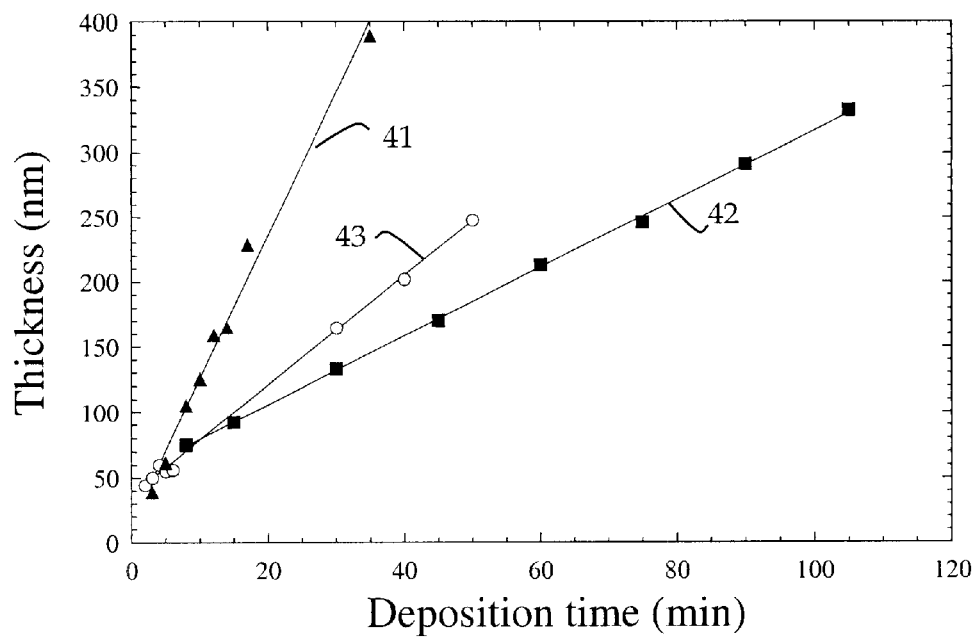
FIG. 4 depicts, according to an embodiment of the invention, the thickness of the deposited Cu layer versus deposition time using electroless deposition of three different plating solutions being a tartrate$^{2-}$ ions based salts plating solution comprising $CuSO_4$ in an amount of 0.0144 mol/l and a tartrate$^{2-}$ ions based salt in an amount of 0.0166 mol/l (42); a tartrate$^{2-}$ ions based salts plating solution comprising $CuSO_4$ in an amount of 0.0443 mol/l and a tartrate$^{2-}$ ions based salt in an amount of 0.0499 mol/l (43); a diethyltartrate based plating solution comprising $CuSO_4$ in an amount of 0.0288 mol/l and diethyltartrate in an amount of 0.1461 mol/l (41).
Figure 5:
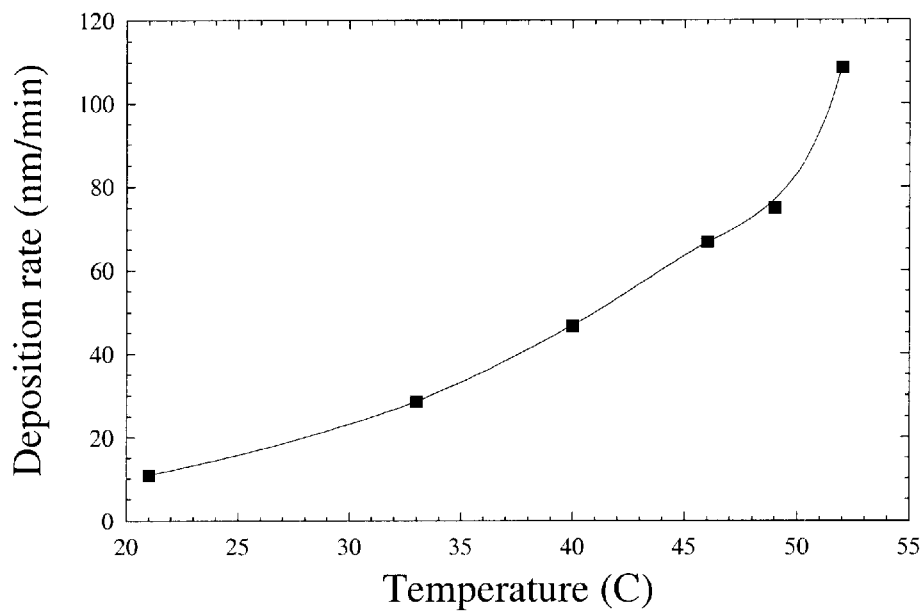
FIG. 5 depicts, according to an embodiment of the invention, the thickness of the deposited Cu layer versus the deposition temperature using electroless deposition of a diethyltartrate based electroless plating solution.

Electroless plating can be performed at temperatures up to 55° C. However, the stability of the plating solution deteriorates substantially when the plating solution is kept at temperatures above about 45° C. For instance, the stability of the solution was found to be reduced to approximately 1 day at 40° C. as compared to more than 30 days at room temperature. Consequently, preferably the temperature range for electroless plating with the plating solution of the present invention is between 20 and 40° C. The copper deposition rate follows a perfect Arrhenius behavior in function of the temperature of the solution with an activation energy of 56.13 kJ mol$^{-1}$ (41) (see FIGS. 4 and 5)) in the temperature range between 20 and 55° C. As depicted in FIG. 5 deposition rates are 31.6 nm min$^{-1}$ at 34° C. and 46.4 nm min$^{-1}$ at 40° C., respectively. In case a conventional tartrate$^{2-}$ ions based salt plating solution is used then the deposition rates (42) (43) are substantially lower.

Figure 6:
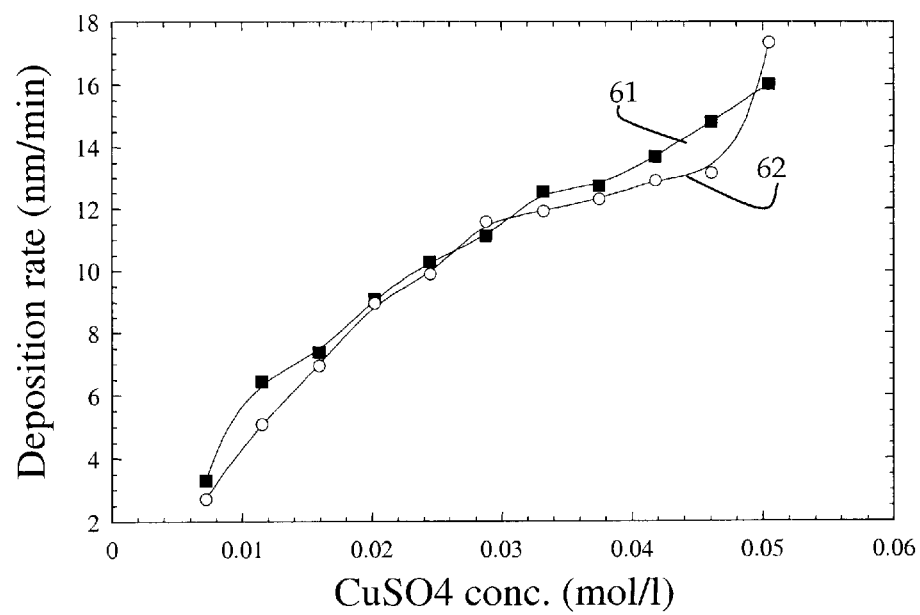
FIG. 6 depicts, according to an embodiment of the invention, the deposition rate of a diethyltartrate based plating solution versus the concentration of $CuSO_4$ in the solution for two different compositions of the solution being a solution with diethyltartrate in an amount of 0.1461 mol/l (61); and a solution with diethyltartrate in an amount of 0.256 mol/l (62);.

As a best mode embodiment of the invention, a plating solution is disclosed having the following composition: Cu$^{2+}$ (as CuSO$_4$.5H$_2$O) (0.029 M), diethyltartrate (0.146 M), and formaldehyde (0.67 M). The pH is adjusted with [Me$_4$N]OH to an optimum value of 12.5. The procedure for making up the plating bath involves mixing of the Cu(II) and diethyltartrate stock solutions, adding water to almost final volume, first pH adjustment to 12.5; addition of formaldehyde, reestablishing the pH value to 12.5, and finally adding water to the final solution volume. The stability of this solution at room temperature exceeds 30 days which is an important improvement compared with conventional plating solutions which have a limited stability of typically one week or at most two weeks. Decrease of the copper ion concentration in the plating solution results in lower deposition rates as can be seen in FIG. 6. However, the copper layer characteristics do not change appreciably by changing the copper concentration and/or by changing the organic tartrate concentration (61) (62) in the plating solution of the present invention. Also, the formaldehyde concentration is not that critical for obtaining a good copper quality; however too large an excess should be avoided because hydrogen evolution is favored at higher formaldehyde concentration levels, i.e. more than about 1 M. This decreased sensitivity of the precise amounts in the plating solution composition and the increased stability of the organic tartrate based plating solution makes this plating solution suitable for industrial application.

Figure 3:
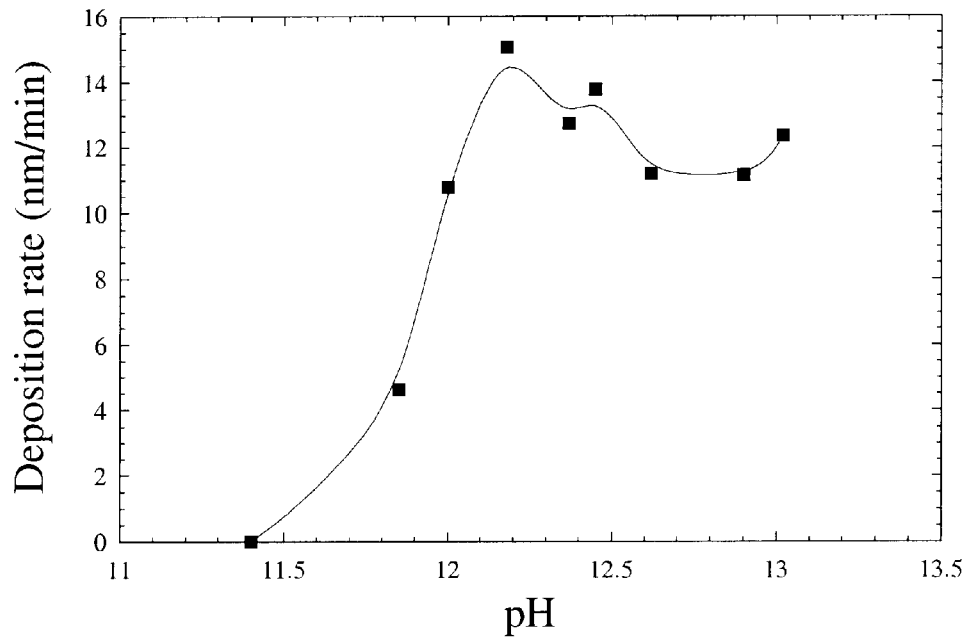
FIG. 3 depicts, according to an embodiment of the invention, the deposition rate of a diethyltartrate based Cu plating solution versus the pH value of the solution.

Further according to this example, a Cu-containing layer is formed on a Ti/TiN stack. The Ti/TiN was deposited by means of a physical vapor deposition (PVD) process. Deposition can also be executed by means of ALCVD. The following characteristics for the plating process and the deposited copper layers are obtained. In the pH range between 12.0 and 13.0, as in FIG. 3, the deposition rate amounts to approximately 13 nm per minute at room temperature (21° C.) and does not change with deposition time (thickness increases linearly with deposition time). Specific resistivity values between 4.10 and 4.65 $\mu\Omega$cm are obtained for a layer thickness in the range of 275 to 300 nm. Thinner layers of electroless copper have higher resistivity values, as is also known from copper films deposited by PVD and especially by chemical vapor deposition (CVD) methods.

For instance, a 110 nm thick electroless copper film shows a specific resistivity of 5.63 $\mu\Omega$cm. However, deposition at higher temperatures results in a significant decrease of the specific resistivity of electroless copper layers deposited with the plating solution of the present invention. For instance, a copper film of 160 nm deposited at 40° C. shows a specific resistivity of only 4.0 $\mu\Omega$cm. Typical sheet resistance uniformity over a 6 inch wafer with a PVD deposited Ti/TiN stack is around 6.6% (standard deviation, 1 sigma, as measured over 49 points by a four-point probe measurement).

The deposition of Cu films as seed layers for Cu electroplating (with the ECD technique) is compared for an electroless plating method according to the best mode embodiment of the invention, and for copper films deposited with the PVD technique. Electroless Cu seed layers and ECD Cu films were deposited in an EQUINOX tool as commercially available from the company SEMITOOL. 6" silicon wafers with different width trenches are used. The trenches are etched in an oxide slayer formed on the silicon wafer. Trench depth was 1 $\mu$m and 1.2 $\mu$m, for different lots of wafers. 1 $\mu$m thick ECD Cu films were deposited on 80 nm Cu seed layers (electroless or PVD) on 15 nm/60 nm of Ti/TiN layers. Electroless Cu seed layers are deposited in Equinox at standard conditions from Na-free electroless bath followed by a RTP anneal (350 C., 2 min, N2). A second anneal step was performed after ECD copper deposition. Thereafter an edge bead removal step, CMP, and post-CMP clean (H$_2$O) were done. Wafers were electrically tested after CMP. Some of the wafers were used for FIB SEM (FEI200) and SEM (Philips XL30) analysis. The copper seed layers deposited from the Na-free electroless copper bath, according to the best mode embodiment of the invention, had good uniformity and conformality in trenches with aspect ratio of at least up to 3. ECD copper deposited on electroless Cu seed layers showed excellent filing capability in 1.2 $\mu$m as well as in 1 $\mu$m deep trenches. Trenches with different widths (from 0.3 $\mu$m up to 10 $\mu$m) were electrically measured. The results show that electroless Cu seed layers can be deposited in trenches with an aspect ratio of at least up to 3.5 (1.2 $\mu$m: 0.35 $\mu$m). ECD Cu films plated on electroless Cu seed layers have reasonable effective specific resistivity about 2.3 $\mu\Omega$-cm for trenches with width from 0.35 $\mu$m to 0.7 $\mu$m and 2.12 $\mu\Omega$-cm for 3 $\mu$m width trenches. Similar results are obtained for ECD Cu films deposited on PVD Cu seed layers.

Figure 7:
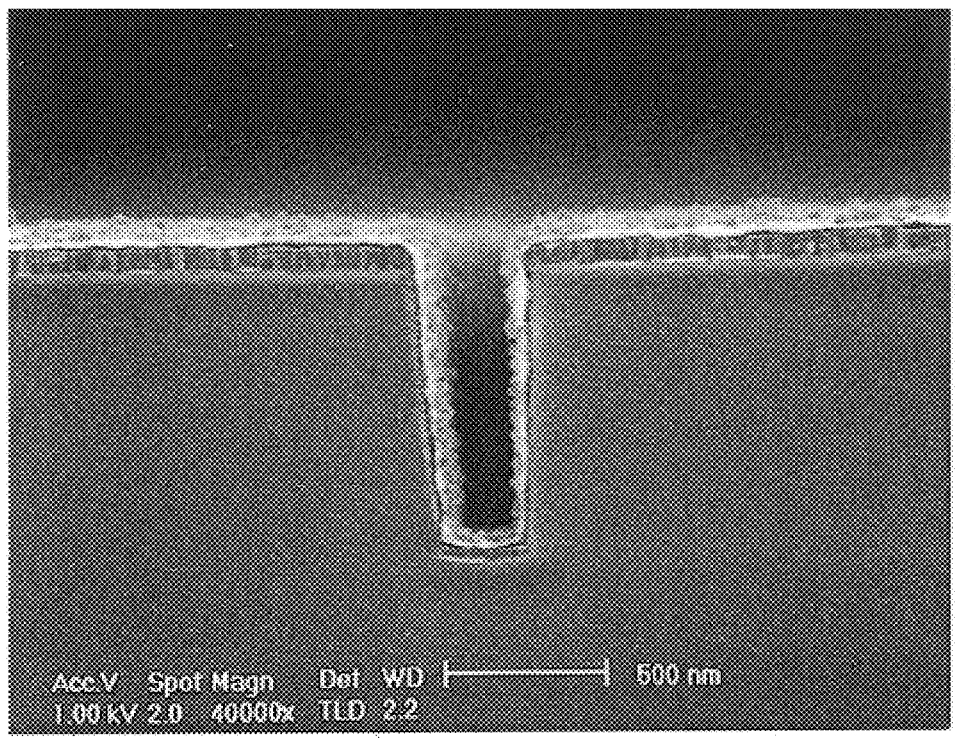
FIG. 7 depicts, according to an embodiment of the invention, Cu seed layers formed using a electroless deposition of a diethyltartrate based plating solution, on top of a Ti/TiN stack. This Ti/TiN stack is formed on wafers (substrates) with single damascene trench test structures having widths down to 0.4 micron and aspect ratio of 2.5.
Figure 7:
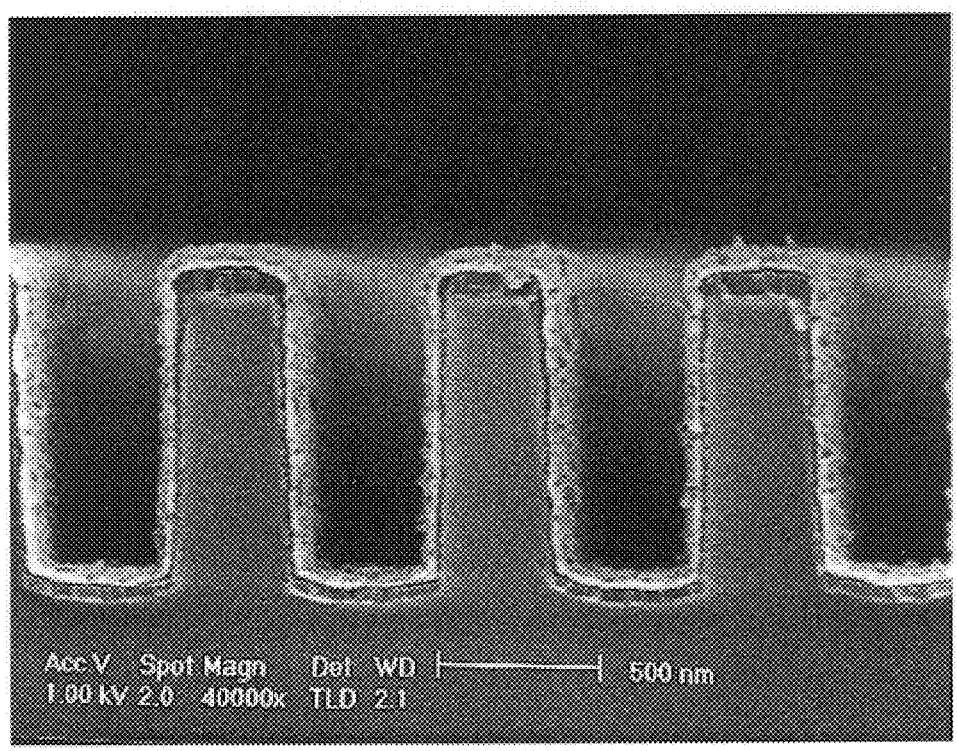
Figure 8:
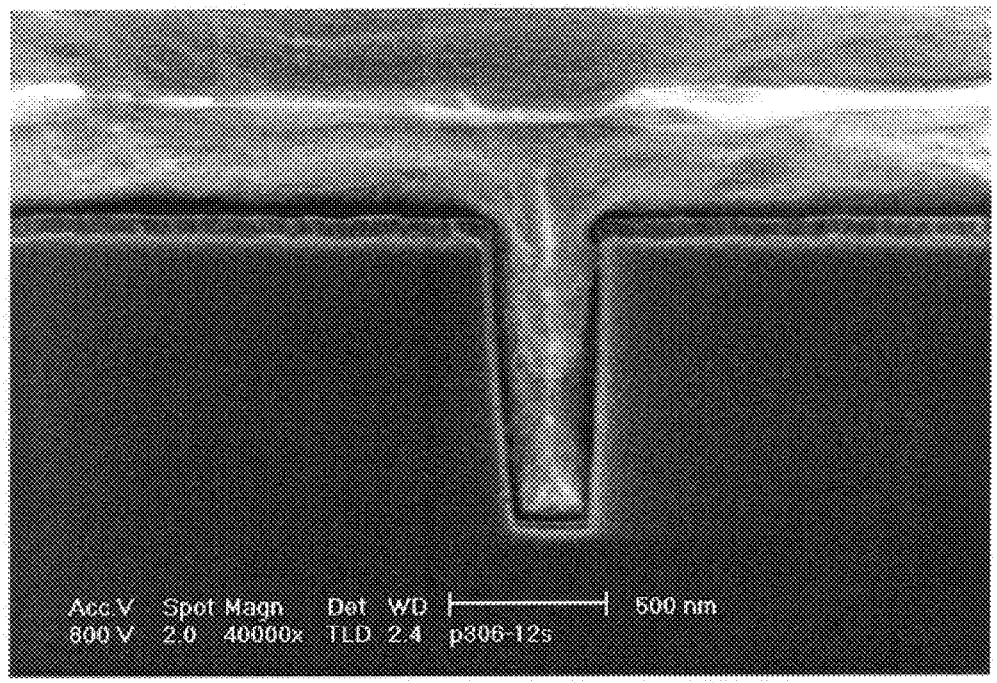
FIG. 8 depicts the same single damascene trench test structures as in FIG. 5 wherein these trench structures are completely filled with Cu using an electroplating technique.
Figure 8:
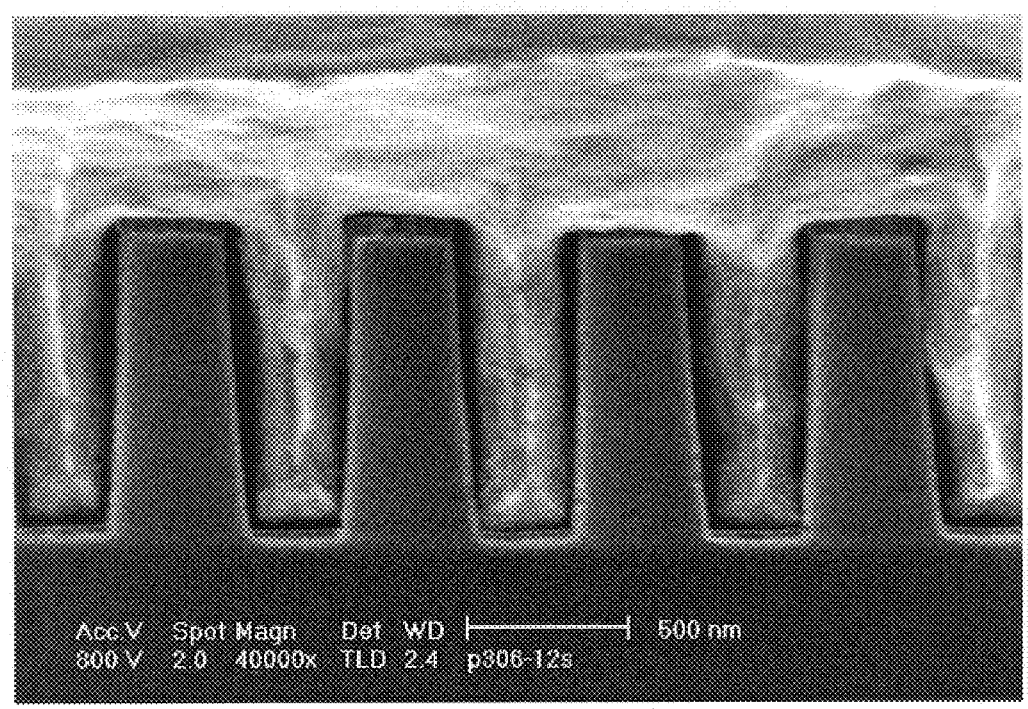

Further according to the method of the present invention, a method for filling an opening in an insulating layer is disclosed, wherein, after forming at least one opening in an insulating layer formed on a substrate, a barrier layer is formed on at least one inner wall of said opening. A Cu-containing metal, i.e. an alloy of or pure Cu, is deposited using the electroless plating solution of the present invention. This deposition can be performed in a chamber of a electroplating tool. The obtained Cu layer can be used as seed layer (as in FIG. 7) for the deposition of electroplated copper on both blanket wafers, i.e. without openings, and wafers with single damascene trench test structures with widths down to 0.4 micron and with an aspect ratio of 2.5. For instance on this seed layer, a second Cu-containing metal layer can be formed by means of electroplating. As an example, excellent filling (FIG. 8) is obtained with such a combination of layers on top of a Ti/TiN stack. Adhesion is adequate for a layer thickness as typically required for seed layer applications. Anneal in inert atmosphere (nitrogen) of the seed layer prior to copper electroplating results in good adhesion of the total layer with a thickness up to at least 1.1 micron, but the invention is in no way limited to this thickness range.

The method of the present invention can be used for the fabrication of integrated circuits, particularly in sub 0.35 $\mu$m CMOS or BiCMOS processes. Particularly these integrated circuits comprise interconnect structures wherein during the process of forming said interconnect structures openings, e.g. via openings or contact openings or trenches, with a sub 0.5 $\mu$m diameter and with high aspect ratios, i.e. typically with an aspect ratio of 2:1 or higher, have to be filled. The method of the present invention allows at least forming of high quality Cu-containing seed layers in a reliable way but also complete filling of these openings can be obtained. Particularly in an embodiment of the invention an integrated circuit comprising an interconnect structure is disclosed, wherein the process of forming said interconnect structure comprises the method of the present invention for creating Cu-containing metal layers on a Cu diffusion barrier layer.

What is claimed is:

1. An aqueous solution for electroless deposition of Cu on a substrate comprising:

a source of copper Cu (II) ions;

a reducing agent;

an additive to adjust the pH of said aqueous solution to a value between 11 and 13.5; and a chemical compound for complexing said Cu ions, said chemical compound having at least one part with chemical structure CHOH—COOR1, R1 being selected from the group consisting of dimethyl, diethyl, and diisopropyl covalently bound to the carboxylate group (COO).

2. The solution as recited in claim 1, wherein the temperature of said aqueous solution for electroless deposition of Cu is about 45 degrees C. or below.

3. The solution as recited in claim 1, wherein said reducing agent is selected from the group consisting of formaldehyde and paraformaldehyde, said reducing agent having a concentration of less than or equal to about 1.0M.

4. The solution as recited in claim 1, wherein said chemical compound is selected from the group consisting of diethyltartrate, diisopropyltartrate and diethylacetate.

5. An aqueous solution for electroless deposition of Cu on a substrate comprising:

a source of copper Cu (II) ions;

a reducing agent;

an additive to adjust the pH of said aqueous solution to a value between 11 and 13.5; and a chemical compound for complexing Cu (II) ions, said chemical compound having chemical structure COOR1-CHOH—CHOH—COOR1, R1 being selected from the group consisting of dimethyl, diethyl, and diisopropyl covalently bound to the carboxylate group (COO).

6. The solution as recited in claim 5, wherein said reducing agent is selected from the group consisting of formaldehyde and paraformaldehyde.

7. The solution as recited in claim 5, wherein said chemical compound is selected from the group consisting of diethyltartrate, diisopropyltartrate and dimethyltartrate.

8. A method for forming a Cu-containing layer on a substrate comprising the steps of:

preparing an aqueous solution comprising a source of copper Cu (II) ions, a reducing agent, a chemical compound for complexing said Cu (II) ions, said chemical compound having at least one part with chemical structure CHOH—COOR1, R1 being selected from the group consisting of dimethyl, diethyl, and diisopropyl covalently bound to the carboxylate group (COO), and an additive to adjust the pH of the solution to a value between 11 and 13.5; and immersing said substrate in said aqueous solution for a period of time of between 2 and 110 minutes to thereby form said Cu-containing layer at least on an activated surface of said substrate.

9. The method as recited in claim 8, wherein said Cu-containing layer is formed on an activated surface of a Cu diffusion barrier layer formed on the substrate.

10. The method as recited in claim 9, wherein said Cu diffusion barrier layer is at least one layer selected from the group consisting of a Ti layer, a TiN layer, a Ta layer, a tungsten nitride layer, a TaN layer, and a Co layer.

11. The method as recited in claim 8, wherein said chemical compound is selected from the group consisting of diethyltartrate, diisopropyltartrate and dimethyltartrate.

12. The method as recited in claim 8, wherein after preparing said aqueous solution, said substrate and said solution are introduced in a chamber of an electroplating tool.

13. The method as recited in claim 12, wherein after immersing said substrate in said aqueous solution, a Cu-containing metal is deposited on said Cu-containing layer formed on said substrate in a chamber of said electroplating tool by means of electroplating.

14. The method as recited in claim 13, wherein the thickness of said Cu-containing layer is between about 40 nm and about 2000 nm.

15. The solution as recited in claim 1, wherein the pH of said aqueous solution is in the range of from about 11.5 to about 13.5.

16. The solution as recited in claim 3, wherein said reducing agent has a concentration of below about 1 M.

17. The method as recited in claim 8, wherein the pH of said aqueous solution is the range of from about 11.5 to about 13.5.

18. The method as recited in claim 14, wherein the thickness of said Cu-containing layer is between about 40 nm and about 600 nm.

19. The method as recited in claim 18, wherein the thickness of said Cu-containing layer is between about 40 nm and about 250 nm.

* * * * *